(12) United States Patent
Kim

(10) Patent No.: US 7,839,077 B2
(45) Date of Patent: Nov. 23, 2010

(54) ORGANIC LIGHT EMITTING DISPLAY AND METHOD OF FABRICATING THE SAME

(75) Inventor: Eun-Ah Kim, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 321 days.

(21) Appl. No.: 11/512,638

(22) Filed: Aug. 30, 2006

(65) Prior Publication Data

US 2007/0046186 A1 Mar. 1, 2007

(30) Foreign Application Priority Data

Aug. 30, 2005 (KR) ...................... 10-2005-0080331

(51) Int. Cl.
*H01J 1/62* (2006.01)
*H01J 63/04* (2006.01)

(52) U.S. Cl. ........................ 313/504; 313/483; 313/498; 313/500; 313/503; 313/505; 313/506

(58) Field of Classification Search ........................ None
See application file for complete search history.

(56) References Cited

U.S. PATENT DOCUMENTS

| | | | | |
|---|---|---|---|---|
| 6,246,168 | B1* | 6/2001 | Kishi et al. ................. | 313/495 |
| 6,555,840 | B1* | 4/2003 | Hudson et al. .............. | 313/498 |
| 6,593,689 | B2* | 7/2003 | Hayashi et al. ............. | 313/504 |
| 2001/0045565 | A1* | 11/2001 | Yamazaki .................... | 313/504 |
| 2004/0259283 | A1 | 12/2004 | Koo et al. | |
| 2005/0184650 | A1* | 8/2005 | Peng et al. ................... | 313/503 |

FOREIGN PATENT DOCUMENTS

| | | |
|---|---|---|
| CN | 1477912 | 2/2004 |
| CN | 200610127711.0 | 5/2009 |
| JP | 62-287596 | 12/1987 |
| JP | 2001 176672 | 6/2001 |
| JP | 2001-236027 | 8/2001 |
| JP | 2001-237082 | 8/2001 |
| JP | 2001-319778 | 11/2001 |
| JP | 2002-122886 | 4/2002 |
| JP | 2002 207440 | 7/2002 |
| JP | 2002 532848 | 10/2002 |
| JP | 2003 233329 | 8/2003 |

(Continued)

OTHER PUBLICATIONS

Machine translation of Shibusawa (JP 2004-119207).*

(Continued)

*Primary Examiner*—Nimeshkumar D Patel
*Assistant Examiner*—Natalie K Walford
(74) *Attorney, Agent, or Firm*—Knobbe Martens Olson & Bear LLP

(57) ABSTRACT

An organic light emitting display (OLED) and a method of fabricating the same are provided. The OLED includes: a substrate; a pixel electrode disposed on the substrate and having cells divided into a plurality of cells and cutting patterns connected to the cells; an organic layer having at least an emission layer and disposed on the pixel electrode; and an upper electrode disposed on the organic layer, thereby minimizing the damage of the device and performing laser-repair.

15 Claims, 6 Drawing Sheets

FOREIGN PATENT DOCUMENTS

| | | |
|---|---|---|
| JP | 2004 021087 | 1/2004 |
| JP | 2004-119207 | 4/2004 |
| JP | 2004-255936 | 9/2004 |
| JP | 2005-227788 | 8/2005 |
| JP | 2006 073370 | 3/2006 |
| KR | 10-2001-0060832 A | 7/2001 |
| KR | 10-2003-0086821 A | 11/2003 |
| KR | 10-2004-0060103 A | 7/2004 |
| KR | 10-2004-0067964 A | 7/2004 |
| KR | 10-2004-0107741 A | 12/2004 |
| KR | 10-2005-0014597 A | 2/2005 |
| WO | WO 0036662 A1 * | 6/2000 |

OTHER PUBLICATIONS

Korean Office Action issued Sep. 26, 2006 in Korean Patent Application No. 10-2005-0080331.

Japanese Office Action issued on Jun. 2, 2009 in the corresponding Japanese Patent Application No. 2006-233518.

* cited by examiner

ORGANIC LIGHT EMITTING DISPLAY AND METHOD OF FABRICATING THE SAME

CROSS-REFERENCE TO RELATED APPLICATION

This application claims priority to and the benefit of Korean Patent Application No. 10-2005-0080331, filed on Aug. 30, 2005, the disclosure of which is incorporated herein by reference in its entirety.

BACKGROUND OF THE INVENTION

1. Field of the Invention

The present invention relates to an organic light emitting display (OLED) and a method of fabricating the same, and more particularly, to an OLED having a pixel electrode structure which permits laser-repairing and minimizing damage of the device, and a method of fabricating the same.

2. Description of the Related Technology

Among flat panel displays (FPDs), an organic light emitting display (OLED) is an emissive device that has a wide viewing angle and a fast response speed of about 1 ms or less. Also, the OLED can be fabricated to a small thickness at low costs and has good contrast, and thus has attracted much attention as a next generation flat panel display.

Such an OLED typically includes an anode, a cathode and an emission layer interposed between these two electrodes. When a voltage is applied between the anode and the cathode, holes and electrons move to the emission layer, and are recombined in the emission layer to emit light.

In an OLED, dark spots which do not emit light even though a voltage is applied thereto may be created by a short circuit between the anode and cathode.

FIG. 1 is a photograph showing an OLED having a plurality of unit pixels. Referring to FIG. 1, a dark pixel d that does not emit light may cause the OLED to malfunction.

FIGS. 2A to 2C are micrographs, taken with a scanning electron microscope, of a region in which a dark pixel is formed. Referring to FIGS. 2A to 2C, the causes of the dark pixel can be seen.

As shown in FIG. 2A, an emission layer may be shorted due to an error during its fabrication process. It can be seen that the dark spot corresponds to a region where the emission layer is shorted.

The dark spot may also be caused by a particle created during the formation of the emission layer or a cathode as shown in FIG. 2B. The dark spot may also result from a failure of an underlying layer pattern as shown in FIG. 2C. In addition, while driving the OLED, the dark spot may occur due to concentration of electric field in a potential failure part.

In an active matrix (AM) OLED, the dark spot defect occurs due to a local short circuit between the anode and the cathode. One of the problems of such a dark spot is that as time elapses, the dark spot grows in size until finally a unit pixel having the dark spot becomes a dark pixel which cannot be not turned on. Thus, the reliability of the OLED deteriorates.

Conventionally, attempts were made to fix dark spots through a laser repair process in which a laser beam is applied to impurities such as particles to remove the impurities. The laser beam removes impurities, but it may also damage a region surrounding the impurities. Such damage can provide a path for moisture or oxygen to infiltrate to pixels, thereby reducing the lifespan of the OLED.

SUMMARY OF CERTAIN INVENTIVE ASPECTS

One aspect of the invention provides an organic light emitting display device (OLED). The OLED comprises: an array of pixels comprising a common electrode common to a plurality of pixels, a plurality of pixel electrodes, and a plurality of organic light-emitting layers, each organic light emitting layer being formed between one of the pixel electrodes and the common electrode; wherein the plurality of pixel electrodes comprises a first pixel electrode, which comprises a conductive layer with a plurality of perforations formed therein, the plurality of perforations generally segmentizing the layer into a plurality of portions.

The plurality of portions may be electrically connected. The plurality of pixel electrodes may comprise a second pixel electrode, which comprises a conductive layer with a plurality of perforations formed therein, the plurality of perforations generally segmentizing the layer into a plurality of portions, and at least one of the portions may be electrically isolated from the rest of the plurality of portions. An unwanted conductive particle may contact the at least one portion of the pixel electrode. The unwanted conductive particle may further contact the common electrode. The at least one electrically isolated portion may be substantially shorted to the common electrode.

The plurality of portions may be shaped in a square, rectangle, circle, triangle, or polygon. The plurality of portions may be arranged in a matrix pattern. The plurality of perforations may comprise through holes or discontinuous areas formed in the conductive layer. At least part of the through holes or discontinuous areas may be elongated. One of the through holes may physically separate two neighboring portions formed on both sides thereof, wherein the two neighboring portions are separated by the through hole about 5 μm or less. Along an imaginary line formed by linearly arranged perforations, an accumulated distance of the perforations may be greater than an accumulated distance of nonperforated areas. The pixel electrode may be an anode and the common electrode may be a cathode. An organic material may be formed into at least part of the plurality of perforations.

Another aspect of the invention provides a method of making an organic light emitting display device (OLED). The method comprises: forming a pixel electrode, the pixel electrode comprising a layer with a plurality of perforations formed therein, the plurality of perforations generally segmentizing the layer into a plurality of portions; forming an organic light-emitting layer over the pixel electrode; and forming a common electrode over the organic light-emitting layer.

Forming the pixel electrode may comprise: forming a conductive layer; and forming the perforations through the conductive layer. The perforations may be formed using photolithography. The plurality of portions may be electrically connected. The plurality of portions may be shaped in a square, rectangle, circle, triangle, or polygon. The plurality of portions may be arranged in a matrix pattern.

The method may further comprise, after forming the common electrode: determining whether there is an electrical short between the pixel electrode and the common electrode; locating at least one of the segmentized portions of the pixel electrode where the electrical short occurs; and electrically isolating the at least one portion from the other portions of the pixel electrode. Determining may comprise determining whether the pixel emits light when appropriately stimulated. Electrically isolating may comprise applying a laser beam to the pixel electrode along perforations that define the boundary of the at least one portion so as to connect the perforations and thereby electrically isolating the at least one portion.

Another aspect of the invention provides an organic light emitting display (OLED) which can minimize damage of a device caused by a laser repair, and a method of fabricating the same.

Another aspect of the invention provides an OLED. The OLED includes: a substrate; a pixel electrode disposed on the substrate, and including a cutting unit cell divided into a plurality of cells and cutting patterns connecting the cutting unit cells; an organic layer including at least an emission layer and disposed on the pixel electrode; and an upper electrode disposed on the organic layer.

The combined length of the cutting patterns surrounding each cell may be smaller than a half of the circumference of each cell. A distance between the cells may be 5 μm or less. The substrate may include at least two thin film transistors, at least one capacitor, and at least two insulating layers.

Another aspect of the invention provides a method of fabricating an OLED. The method includes: preparing a substrate; forming a conductive layer on the substrate; dividing the conductive layer into a plurality of cutting unit cells, and patterning each cutting unit cell with a pixel electrode including cutting patterns connected to each other; forming an organic layer including at least an emission layer on the pixel electrode; and disposing an upper electrode on the organic layer.

The method may further include: checking whether a dark pixel of the OLED fabricated by the above-mentioned method is generated; and when the dark pixel of the OLED is generated, detecting a cell having a short circuit which is a cause of the dark pixel, and laser-repairing the cutting pattern connected to the cell.

BRIEF DESCRIPTION OF THE DRAWINGS

The above and other features of the invention will be described in reference to certain exemplary embodiments thereof with reference to the attached drawings in which.

DETAILED DESCRIPTION OF CERTAIN INVENTIVE EMBODIMENTS

Certain embodiments will now be described with reference to the accompanying drawings.

Figure 1:
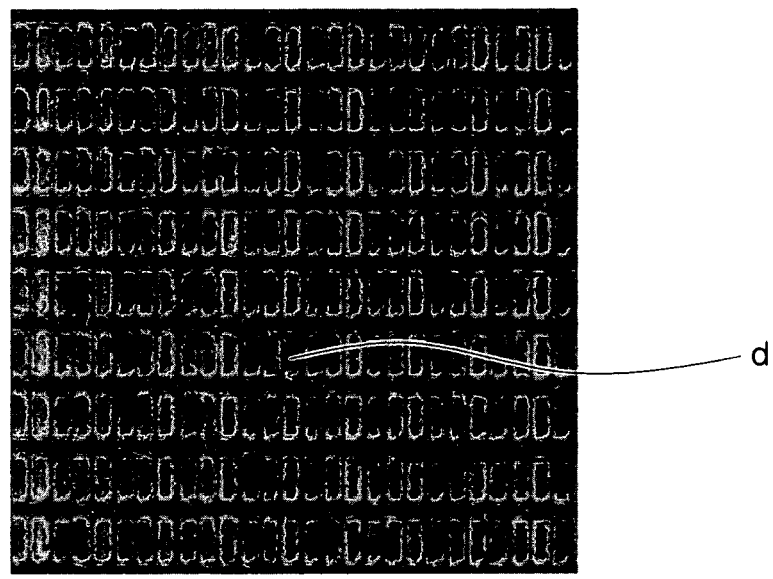
FIG. 1 is a photograph showing an organic light emitting display (OLED) having a plurality of unit pixels being driven.
Figure 2A:
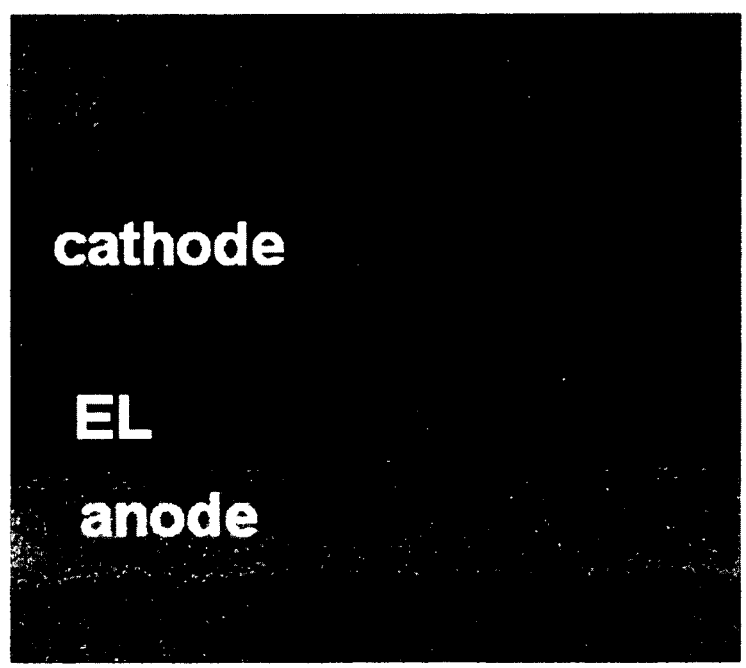
FIGS. 2A to 2C are micrographs, taken with a scanning electron microscope, of a region in which a dark pixel is generated.
Figure 2B:
Figure 2C:
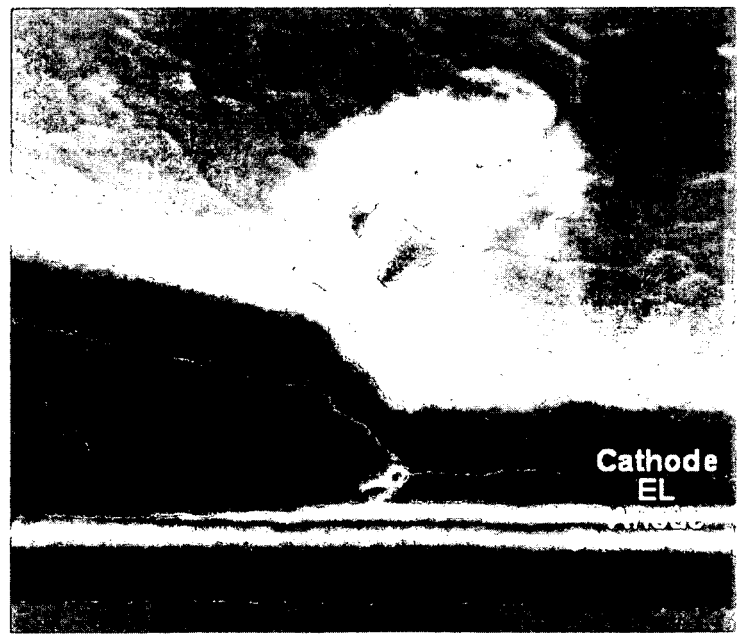
Figure 3:
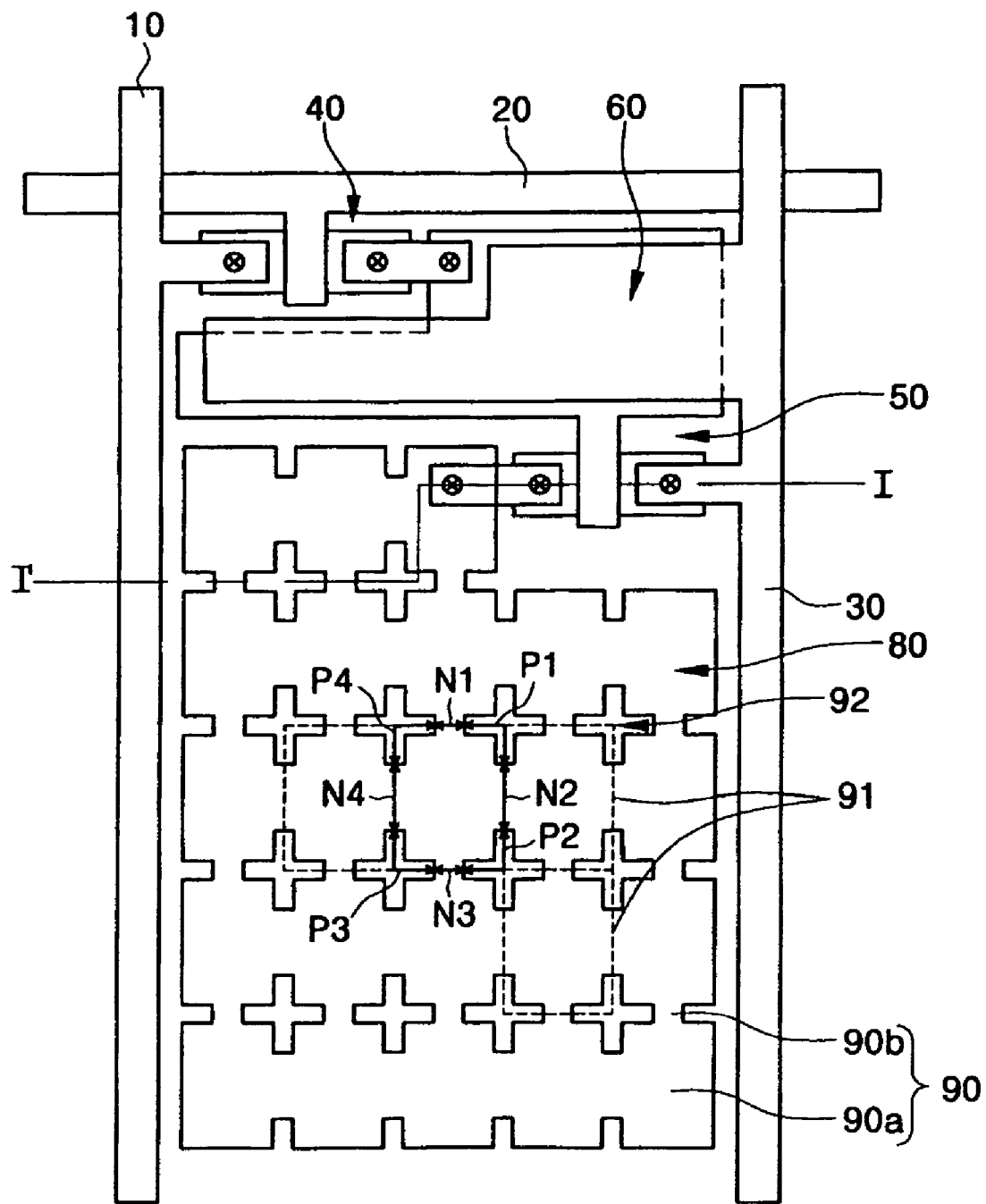
FIG. 3 is a top plan view of a unit pixel of an OLED according to an embodiment.

FIG. 3 is a plan view of a unit pixel of an organic light emitting display (OLED) according to an embodiment. Referring to FIG. 3, a data line 10, a scan line 20, and a common power voltage line 30 are disposed. The scan line 20 intersects with and is insulated from the data line 10. The common power voltage line 30 intersects with and is insulated from the scan line 20. The common power voltage line 30 runs parallel to the data line 10. A unit pixel is defined by the data line 10, the scan line 20 and the common power voltage line 30. The lines may be randomly arranged, or may be disposed in a different manner.

The unit pixel includes a switching thin film transistor 40, a driving thin film transistor 50, a capacitor 60 and an organic light emitting diode 80. The switching thin film transistor 40 is driven by a scan signal applied to the scan line 20. The switching thin film transistor 40 serves to transmit a data signal applied to the data line 10 to the driving thin film transistor 50. The driving thin film transistor 50 determines an amount of current flowing through the organic light emitting diode 80 by signals transmitted from the switching thin film transistor 40 and the common power voltage line 30, that is, a voltage difference between a gate and a source. Also, the capacitor 60 serves to store the data signal transmitted through the switching thin film transistor 40 for one frame.

The organic light emitting diode 80 includes at least a pixel electrode 90, an organic emission layer and an upper electrode. In one embodiment, the pixel electrode 90 is divided into a plurality of cells 90a. Each cell 90a may be connected to each other by a cutting pattern 90b.

In the context of this document, the term "cells" may be interchangeably used with "portions." In addition, the term "upper electrode" may be interchangeably used with "common electrode." The term "perforations," as used herein, refers to openings generally segmentizing the pixel electrode into a plurality of portions.

The cutting pattern 90b connected to a failure cell in which a dark pixel is generated among the plurality of cells may be irradiated with laser to disconnect the failure cell from a neighboring normal cell. Here, only the cutting pattern 90b is cut, so that damage of a region neighboring the failure cell can be minimized during a laser repair process. Also, since the cutting pattern 90b connected to the failure cell among the plurality of cells is cut, other neighboring normal cells may normally emit light, while the failure cell does not.

When the cutting pattern 90b is cut by laser, in order to minimize damage of a neighboring region during the laser repair process, a combined length of the cutting patterns 90b surrounding each cell may be smaller than a half of the circumference of each of the cells 90a. Referring to FIG. 3, imaginary boundary lines 91 (shown in dotted lines) are formed by perforations 92 between the cells 90a. In the illustrated embodiment, an accumulated distance (a sum of $P_1$ to $P_4$) of the perforations 92 surrounding a cell 90a is greater than an accumulated distance (a sum of $N_1$ to $N_4$) of nonperforated areas 90b. Here, if the length is larger than a half, a region in which laser is radiated becomes wider, and thus the neighboring region may be more damaged.

Figure 4A:
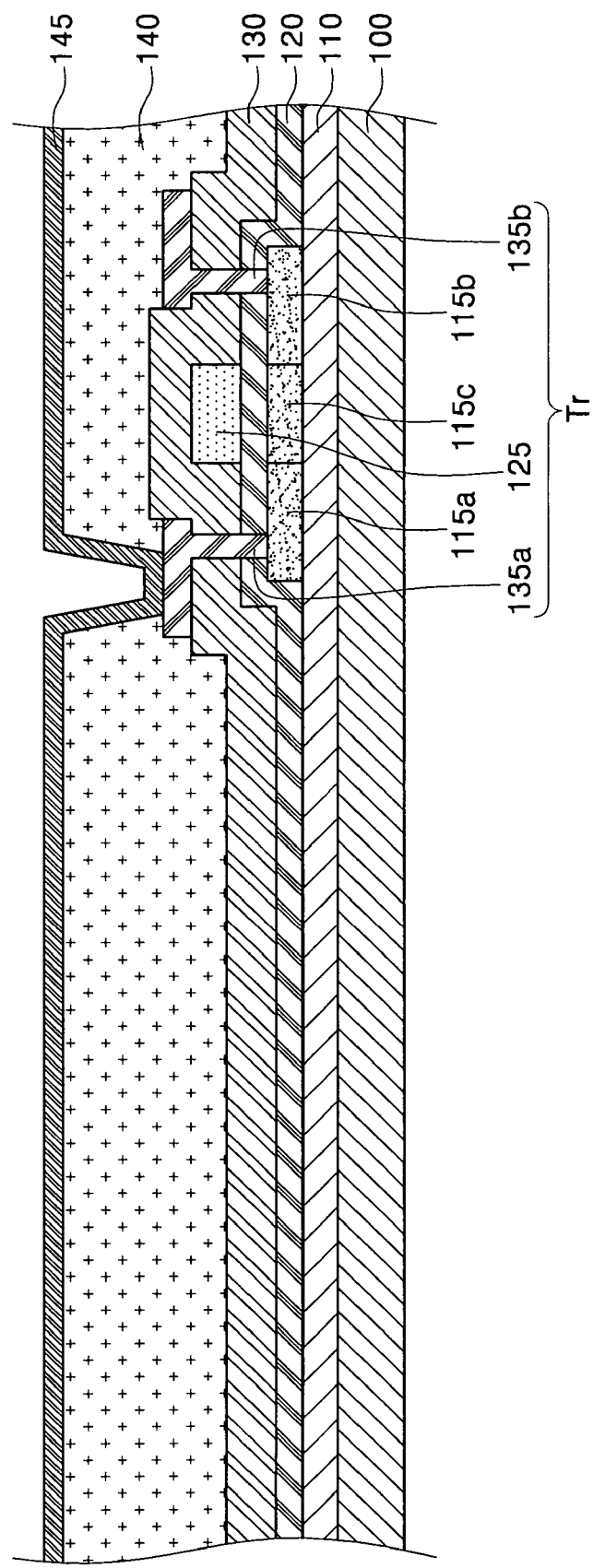
FIGS. 4A and 4B are cross-sectional views, taken along the line I-I' of FIG. 3, which illustrates an OLED according to an embodiment.
Figure 4B:
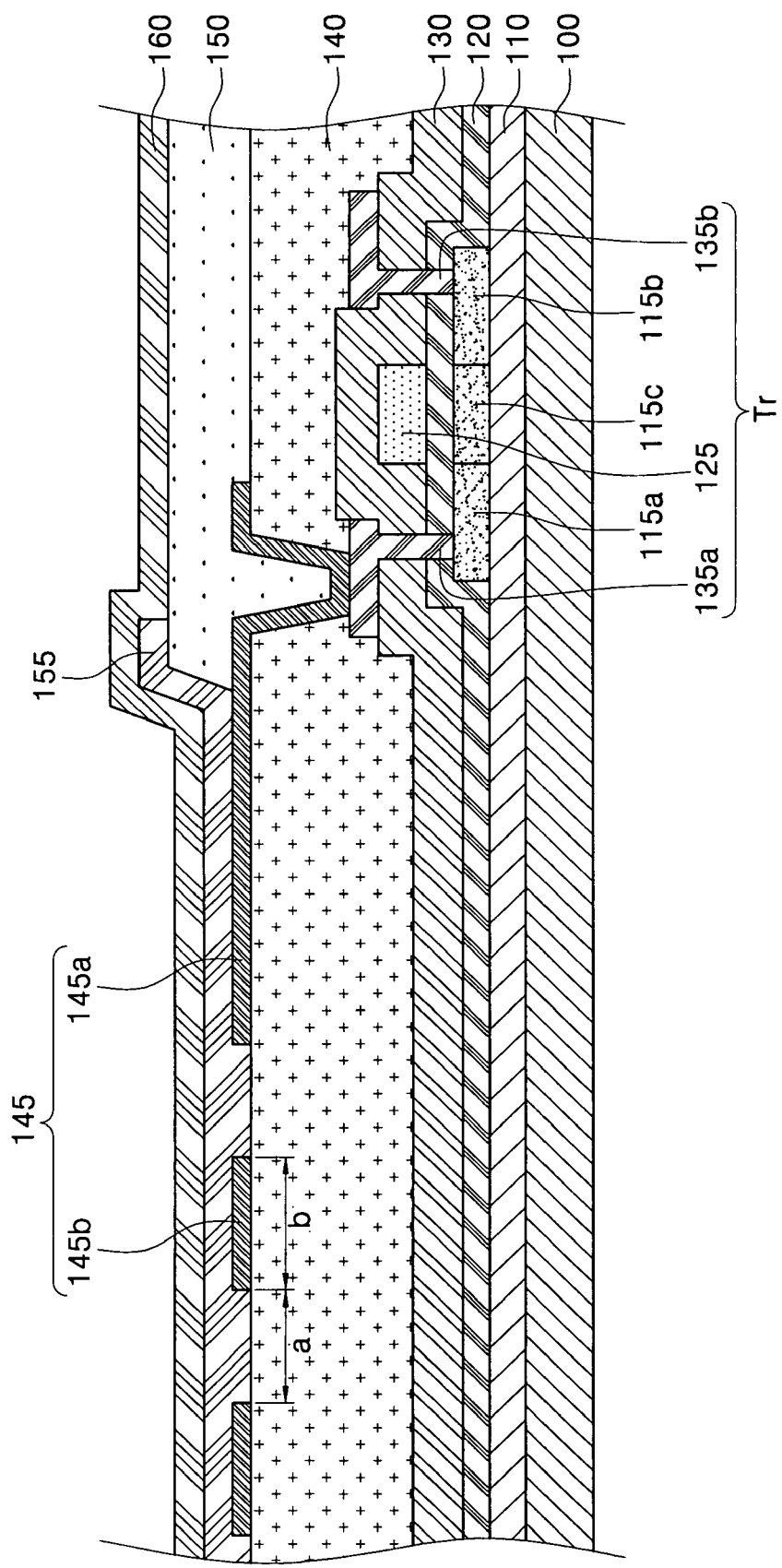

Referring to FIG. 4B, the cells may be short-circuited by a patterning process, and a distance (b) between the cells may be about 5 μm or less to prevent a reduction in an aperture ratio of the pixel electrode.

In the FIG. 3, the cells have a square shape, but are not limited thereto. It may be formed in different shapes.

FIG. 4B is a cross-sectional view taken along the line I-I' of FIG. 3, which illustrates an OLED according to an embodiment. Referring to FIG. 4B, a substrate 100 is provided. A buffer layer 110 may be formed on the substrate 100 in order to prevent out-diffusion of impurities from the substrate 100. In one embodiment, the buffer layer 110 may be formed of a silicon nitride layer, a silicon oxide layer, or a silicon oxynitride layer.

A semiconductor layer 115 is disposed over the buffer layer 110. The semiconductor layer 115 may be an amorphous or crystalline silicon layer, and includes source and drain regions 115a and 115b and a channel region 115c.

A gate insulating layer 120 and a gate electrode 125 are disposed over the substrate having the semiconductor layer 115. An interlayer insulating layer 130 is disposed on substantially the entire surface of the substrate including the gate electrode 125, and source and drain electrodes 135a and 135b electrically connected to the semiconductor layer 115 are disposed.

A passivation layer 140 is disposed over the source and drain electrodes 135a and 135b. The passivation layer 140 may be formed of an inorganic layer, an organic layer, or a stacked layer thereof.

The inorganic layer may be formed of a silicon nitride layer, a silicon oxide layer, or a silicon oxynitride layer. Also, the organic layer may be formed of at least one material selected from the group consisting of polyacrylates resin, epoxy resin, phenolic resin, polyamides resin, polyimides resin, unsaturated polyesters resin, poly(phenylenethers) resin, poly(phenylenesulfides)resin, and benzocyclobutene (BCB).

The passivation layer 140 has a via hole exposing the source or drain electrode 135a or 135b, and a pixel electrode 145 is disposed on the source electrode 135a exposed through the via hole.

When the pixel electrode 145 is an anode, it may be a transparent electrode formed of a metal having a high work function, such as ITO or IZO, or a reflective electrode selected from the group consisting of Pt, Au, Ir, Cr, Mg, Ag, Ni, Al and an alloy thereof. On the other hand, when the pixel electrode 145 is a cathode, it may be a thin transparent electrode selected from the group consisting of Mg, Ca, Al, Ag, Ba and an alloy thereof, which are metals having a low work function, or a thick reflective electrode.

In the illustrated embodiment, the pixel electrode 145 may include a plurality of cells 145a and cutting patterns 145b connecting the cells. Here, when a failure cell is generated among the cells, laser is used to cut the cutting pattern 145b connected to the failure cell. This configuration minimizes damages to a neighboring region which may occur during the laser repair process.

As described above, a total length of the cutting patterns 145b surrounding each cell 145a may be smaller than a half of the circumference of each cell 145a. Thus, when the cutting pattern 145b is cut by laser, the damage to a neighboring region can be minimized.

In one embodiment, a distance (b) between the cells may be about 5 μm or less. If the distance between the cells is wider, the aperture ratio of the pixel electrode may decrease, lowering the luminous efficiency. In other embodiments, however, the distance between the cells may vary depending on the design of the pixel electrode.

A pixel defining layer (PDL) 150 having an opening partially exposing the pixel electrode 145 is formed on the pixel electrode 145. An organic layer 155 including at least an emission layer is disposed on the pixel electrode 145. The organic layer 155 may further include at least one layer selected from the group consisting of a hole injection layer, a hole transport layer, a hole blocking layer, an electron transport layer and an electron injection layer. An upper electrode 160 is formed on the organic layer 155, and thus the OLED may be completed.

If the pixel electrode 145 is an anode, the upper electrode 160, as a cathode, may be a thin transparent electrode selected from metals having a low work function, for example, Mg, Ca, Al, Ag and an alloy of two or more of the foregoing, or a thick reflective electrode. If the pixel electrode 145 is a cathode, the upper electrode 160, as an anode, may be a transparent electrode formed of a metal having a high work function, such as ITO or IZO, or a reflective electrode selected from the group consisting of Pt, Au, Ir, Cr, Mg, Ag, Ni, Al and an alloy of two or more of the foregoing.

FIGS. 4A and 4B are cross-sectional views taken along the line I-I' of FIG. 3, which illustrates a method of fabricating an OLED according to an embodiment.

Referring to FIG. 4A, a substrate 100 is provided. The substrate 100 may be an insulating substrate or a conductive substrate.

A buffer layer 110 may be formed on the substrate 100. The buffer layer 110 serves to prevent out-diffusion of impurities from the substrate 100 in the device fabrication, and to improve characteristics of the device. The buffer layer 110 may be formed of one of a silicon nitride (SiNx) layer, a silicon oxide ($SiO_2$) layer and a silicon oxynitride (SiOxNy) layer.

A semiconductor layer 115 is formed on the buffer layer 110. The semiconductor layer 115 may be formed of an amorphous or crystalline silicon layer. Also, a gate insulating layer 120 is formed on the semiconductor layer 115. The gate insulating layer 120 is formed of an insulating layer, for example, a silicon oxide (SiO2) layer.

A gate electrode 125 is formed over the substrate having the gate insulating layer 120. Impurity ions are injected into the semiconductor layer 115 using the gate electrode 125 as a mask. Source and drain regions 115b and 115a are formed in the semiconductor layer 115 by ion injection, and thus a channel region 115c is defined.

An interlayer insulating layer 130 is formed on the gate electrode 120. Contact holes exposing each of the source and drain regions 115b and 115a are formed in the interlayer insulating layer 130. A conductive layer is disposed on the interlayer insulating layer 130 and then patterned so as to form source and drain electrodes 135b and 135a which are electrically connected to the exposed source and drain regions 115b and 115a, respectively.

A passivation layer 140 is formed over the substrate having the source and drain electrodes 135b and 135a. The passivation layer 140 may be an organic layer, an inorganic layer, or a stacked layer thereof.

Here, the inorganic layer may be formed of a silicon nitride layer, a silicon oxide layer, or a silicon oxynitride layer. The organic layer may be formed of one selected from the group consisting of polyacrylates resin, epoxy resin, phenolic resin, polyamides resin, polyimides resin, unsaturated polyesters resin, poly(phenylenethers)resin, poly(phenylenesulfides) resin and BCB.

A via hole is formed to expose the drain electrode 135a in the passivation layer 140. A conductive layer 145 is electrically connected to the drain electrode 135a through the via hole. Here, the conductive layer 145 may be a transparent layer formed of a metal having a high work function, such as ITO or IZO, or a reflective layer selected from the group consisting of Pt, Au, Ir, Cr, Mg, Ag, Ni, Al and an alloy of two or more of the foregoing. The conductive layer 145 may be a thin transparent layer formed of a metal having a low work function selected from the group consisting of Mg, Ca, Al, Ag, Ba and an alloy of two or more of the foregoing, or a thick reflective layer.

Referring to FIG. 4B, the conductive layer 145 is patterned so as to form a pixel electrode 145. Here, the pixel electrode 145 is divided into a plurality of cutting unit cells 145a. Each cutting unit cell 145a is patterned to be connected by a cutting pattern 145b. In the figure, the cutting unit cell 145a is formed in a square shape, but is not limited to this structure and may be formed in various shapes such as a circle, a triangle, a polygon, and so on. A total length of the cutting patterns 145b surrounding each cutting unit cell 145a may be smaller than a half of the circumference of the cutting unit cell. Also, a distance (b) between the cutting unit cells may be about 5 μm or less.

Subsequently, a PDL 150 is formed on the pixel electrode 145, and then an opening partially exposing the pixel electrode 145 is formed.

An organic layer 155 having an emission layer is formed in the opening. The organic layer 155 may further include at least one layer selected from the group consisting of a hole injection layer, a hole transport layer, a hole blocking layer, an electron transport layer and an electrode injection layer. Here, the organic layer may be formed of a conventional material using a conventional fabrication method, but the invention is not limited thereto.

An upper electrode 160 is formed on the organic layer 155, and thus the OLED is completed.

Figure 5:
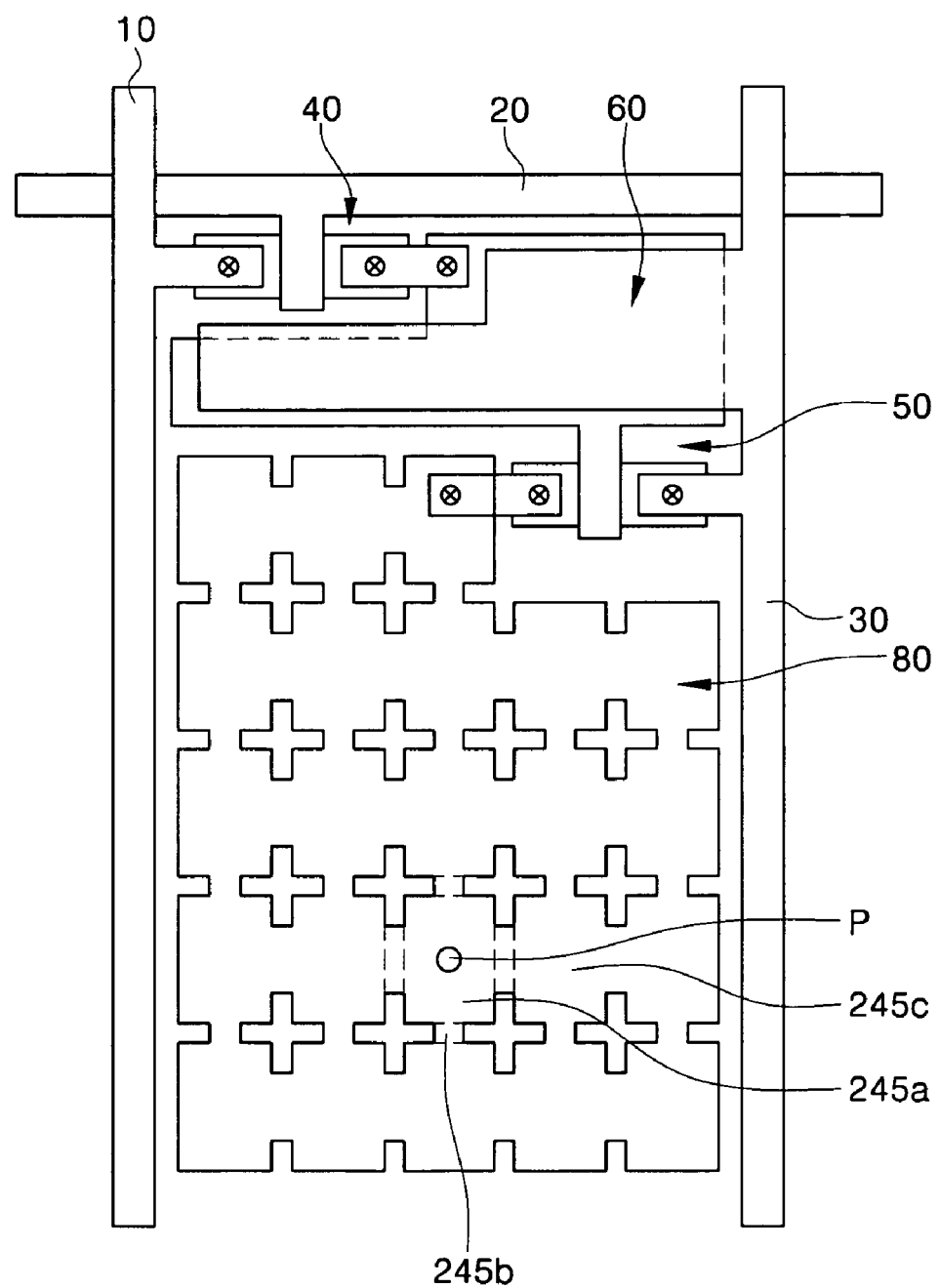
FIG. 5 is a top plan view of an OLED according to an embodiment, which illustrates a laser repair process.

FIG. 5 is a top plan view of an OLED according to an embodiment, which illustrates a laser repair process. Referring to FIG. 5, when a dark spot is generated in the OLED fabricated as described above, the reason can be seen by performing a checking process using a microscope or an automatic screening device. As shown in FIG. 5, when a particle P occurs and then causes a short circuit between a pixel electrode and an upper electrode, a dark spot may be generated. Here, a failure cutting unit cell 245a on which the particle P is located is detected, and a cutting pattern 245b connected to the failure cutting unit cell 245a is irradiated with a laser and then is cut. Here, when a voltage is applied to a unit pixel, the failure cutting unit cell 245a does not emit light, while other normal cells 245c emit light, and thus the unit pixel may normally operate. Here, the laser is not radiated onto the entire region in which the particle is generated, but is locally radiated onto only the cutting pattern 245b connected to the failure cutting unit cell 245a having the particle, and thus damages to the neighboring region can be minimized.

As a result, during the laser repair process, the damages to the neighboring region are minimized and the failure cutting unit cell is repaired, thereby preventing deterioration of reliability of the OLED by the laser repair process. Also, by performing the laser repair process, only the failure cutting unit cell 245a becomes a non-emission region while other normal cutting unit cells normally operate, and thus it is not necessary to disuse the OLED.

According to the embodiments, a pixel electrode is divided into a plurality of cutting unit cells and includes cutting patterns connected to the cutting unit cells, thereby minimizing damages to a neighboring region by laser and providing an OLED which permits a laser repair process. Also, only a failure cutting unit cell is repaired by the laser repair process, and thereby other normal cutting unit cells are normally operable. Thus, it is not necessary to disuse products and can be expected to improve productivity. Also, the laser repair process can minimize damages caused by laser, and thus the reliability of the OLED may be enhanced.

While it is described with reference to exemplary embodiments, it will be understood by those of ordinary skill in the art that various changes in form and details may be made without departing from the spirit and scope of the invention as set forth in the following claims.

What is claimed is:

1. An organic light emitting display device (OLED), comprising:

an array of pixels comprising a common electrode common to a plurality of pixels, a plurality of pixel electrodes, and a plurality of organic light-emitting layers, each organic light emitting layer being formed between one of the pixel electrodes and the common electrode;

wherein the plurality of pixels comprises a first pixel including a first pixel electrode, which comprises a conductive layer with a pattern of perforations formed therethrough;

wherein the plurality of pixel electrodes comprises a second pixel electrode, which comprises a conductive layer with a plurality of perforations formed therein, the plurality of perforations generally segmentizing the layer into a plurality of portions, and wherein at least one of the portions is electrically isolated from the rest of the plurality of portions; and wherein an unwanted conductive particle contacts the at least one portion of the pixel electrode.

2. The device of claim 1, wherein the unwanted conductive particle further contacts the common electrode.

3. The device of claim 1, wherein the plurality of pixel electrodes comprises a second pixel electrode, which comprises a conductive layer with a plurality of perforations formed therein, the plurality of perforations generally segmentizing the layer into a plurality of portions, and wherein at least one of the portions is electrically isolated from the rest of the plurality of portions.

4. The device of claim 3, wherein the at least one electrically isolated portion is substantially shorted to the common electrode.

5. The device of claim 1, wherein the pattern of perforations forms a plurality of portions in the conductive layer in a square, rectangle, circle, triangle, or polygon shape.

6. The device of claim 1, wherein the pattern of perforations forms a plurality of portions in the conductive layer that is arranged in a matrix pattern.

7. The device of claim 1, wherein the plurality of perforations comprises through holes or discontinuous areas formed in the conductive layer.

8. The device of claim 7, wherein at least part of the through holes or discontinuous areas are elongated.

9. The device of claim 7, wherein one of the through holes physically separates two neighboring portions formed on both sides thereof, wherein the two neighboring portions are separated by the through hole about 5 μm or less.

10. The device of claim 1, wherein along an imaginary line formed by linearly arranged perforations, an accumulated distance of the perforations is greater than an accumulated distance of nonperforated areas.

11. The device of claim 1, wherein the pixel electrode is an anode and the common electrode is a cathode.

12. The device of claim 1, wherein an organic material is formed into at least part of the plurality of perforations.

13. The device of claim 1, wherein the perforations are filled with a material different from the conductive layer.

14. The device of claim 1, wherein each portion in the plurality of portions in the conductive layer is physically connected to another portion in the plurality of portions in the conductive layer on at least one side.

15. The device of claim 1, wherein each portion in the plurality of portions in the conductive layer is physically connected to another portion in the plurality of portions in the conductive layer on at least two sides.

* * * * *